(12) United States Patent
Hsu et al.

(10) Patent No.: US 10,269,841 B1
(45) Date of Patent: Apr. 23, 2019

(54) SENSOR PACKAGE AND METHOD OF MANUFACTURING THE SAME

(71) Applicant: Phoenix & Corporation, Grand Cayman (KY)

(72) Inventors: Che-Wei Hsu, Hsinchu County (TW); Shih-Ping Hsu, Hsinchu County (TW)

(73) Assignee: PHOENIX & CORPORATION, Grand Cayman (KY)

( * ) Notice: Subject to any disclaimer, the term of this patent is extended or adjusted under 35 U.S.C. 154(b) by 0 days.

(21) Appl. No.: 15/837,042

(22) Filed: Dec. 11, 2017

(30) Foreign Application Priority Data

Sep. 29, 2017 (TW) .............................. 106133542 A

(51) Int. Cl.
*H01L 31/0203* (2014.01)
*H01L 27/146* (2006.01)

(52) U.S. Cl.
CPC .. *H01L 27/14618* (2013.01); *H01L 27/14636* (2013.01); *H01L 27/14687* (2013.01)

(58) Field of Classification Search
CPC ................................................ H01L 27/14618
USPC ........................................................ 257/434
See application file for complete search history.

(56) References Cited

U.S. PATENT DOCUMENTS

| | | | |
|---|---|---|---|
| 6,409,930 B1 * | 6/2002 | Whitehurst | C23F 1/02 216/13 |
| 6,919,508 B2 * | 7/2005 | Forcier | B81C 1/0023 174/565 |
| 7,235,745 B2 * | 6/2007 | Das | H01G 4/206 174/260 |
| 7,687,724 B2 * | 3/2010 | Das | H05K 1/095 174/260 |
| 7,843,056 B2 * | 11/2010 | Smeys | H01L 21/4853 257/415 |
| 7,901,981 B2 * | 3/2011 | Smeys | H01L 21/4853 257/E21.499 |
| 2013/0069252 A1 * | 3/2013 | Han | H01L 23/3121 257/787 |
| 2013/0228917 A1 * | 9/2013 | Yoon | H01L 23/49811 257/737 |
| 2018/0076166 A1 * | 3/2018 | Yu | H01L 21/56 |

* cited by examiner

*Primary Examiner* — Caleb E Henry
(74) *Attorney, Agent, or Firm* — McClure, Qualey & Rodack, LLP

(57) ABSTRACT

A sensor package includes a sensor, an encapsulation layer, a redistribution layer, a photo-imageable dielectric (PID) layer and via plugs. The encapsulation layer exposes the active surface of the sensor, and the top surface of the encapsulation layer is coplanar with the active surface of the sensor. The redistribution layer covers the top surface of the encapsulation layer and the active surface of the sensor. The PID layer covers the redistribution layer, the encapsulation layer and the active surface of the sensor. The via plugs are disposed around the sensor and through the encapsulation layer. The via plugs are electrically connected to the redistribution layer and the active surface of the sensor. The cross section of the via plug at the top surface of the encapsulation layer has a first hole diameter, and the cross section of the via plug at the bottom surface of the encapsulation layer has a second hole diameter. The first hole diameter is less than the second hole diameter.

13 Claims, 6 Drawing Sheets

SENSOR PACKAGE AND METHOD OF MANUFACTURING THE SAME

CROSS REFERENCE TO RELATED APPLICATIONS

This Non-provisional application claims priority under 35 U.S.C. § 119(a) on Patent Application No. 106133542 filed in Republic of China on Sep. 29, 2017, the entire contents of which are hereby incorporated by reference.

BACKGROUND

1. Technical Field

This invention relates to a semiconductor package structure and a manufacturing method thereof, in particular, to a sensor package and a manufacturing method thereof.

2. Description of Related Art

A sensor is an electronic component, module, or subsystem to detect events or changes in its environment, and to send the information to other electronics. With advances in various sensing technologies and micro-machinery, sensors are now widely used in everyday objects, such as image sensors and fingerprint sensors applied to portable consumer electronics.

An image sensor or imaging sensor is a sensor that detects and conveys the information that constitutes an image. A fingerprint sensor is an electronic device used to capture a digital image of the fingerprint pattern (conductor), and many technologies have been used including optical and capacitive. Optical fingerprint imaging involves capturing a digital image of the print using visible light. Capacitance sensors use principles associated with capacitance in order to form fingerprint images.

However, the molding technology for sensors is more complicated than the molding technology for integrated circuits. An image is captured through an aperture of the package onto the capacitor array or the photoactive region, causing each capacitor to accumulate an electric charge proportional to the charge intensity or light intensity at that location. Both the thickness of the package and the size of the aperture should meet certain specifications to achieve a well-operated sensor package.

FIG. 1 is a schematic diagram illustrating an operation of a prior art fingerprint sensor package 10. As shown in FIG. 1, numbers of capacitance sensors 12 or pressure sensors are formed in a chip 14. When a user press a finger 16 on the covering glass 18 of the fingerprint sensor package 10, fingerprint ridge tops make first contact, followed by the valleys. The capacitance varies between ridges and valleys of the fingerprint due to the fact that the volume between the dermal layer and sensing element in valleys contains an air gap. Varying levels of charge in ridges and valleys are measured by the capacitance sensors 12 in a chip 14. This creates an electrical fingerprint.

FIG. 2 is a schematic diagram illustrating a prior art wire bound (WB) package 20. The WB package 20 includes a sensor 21, a substrate 22, an encapsulating layer 23 and numbers of wires 24. The sensor 21 is disposed on the substrate 22 in the encapsulating layer 23. The sensor 21 includes electric pads (not shown in the figures). The substrate 22 includes input leads and output leads (not shown). The wires 24 are used to interconnect the electric pads of the sensor 21 to the input leads of the substrate 22. The output leads of the substrate 22 extends outside the encapsulation layer 23, so the WB package 20 may be further soldered to an external printed circuit board (not shown). The encapsulation layer 23 provides physical protection, electrical protection, contamination isolation, and water vapor isolation to the WB package 20. However, since the wires 24 extend upward from the top surface of the sensor 21 in the prior art WB package 20, the encapsulating layer 23 should be thick enough to cover the whole wires 24. Thus, the thick WB package 20 is hardly applied to thinning products, such as the under glass sensor package 10 shown in FIG. 1.

FIG. 3 is a schematic diagram illustrating a conventional through silicon via (TSV) package 30. As shown in FIG. 3, a through-silicon via or through-chip via is a vertical interconnect access that passes completely through a silicon wafer or die. An etching process or a laser process is performed on a chip 32 to form numbers of through silicon via holes 34. The through silicon via holes 34 are than filled with conductive materials, such as copper, poly-silicon or tungsten to form numbers of via plugs 36. The chip 32 with via plugs 36 is next connected to a substrate 31 by flip chip technology, and an encapsulating material 33 are molded to protect the chip 32. Accordingly, a TSV package 30 is formed.

However, high accuracies are required for the through silicon via process of the via plugs 36, because a tiny mistake in the through silicon via process may cause a fail chip. Accordingly, the through silicon via process leads to a high manufacturing cost, which is unfavorable to the market. With the development on sensor package technology, it is important to thinning the package and to reduce the manufacturing cost.

SUMMARY OF THE INVENTION

It is therefore an object of the present invention to provide a sensor package and a method of manufacturing the sensor package with a panel level packaging process and a through outside silicon via (TOSV) technology, which provides thinner packages and reduces the manufacturing cost.

To achieve the above, the present invention provides a sensor package including a sensor, an encapsulation layer, a first redistribution layer, a photo-imageable dielectric (PID) layer and numbers of via plugs. The sensor includes at least one side surface, a back surface and an active surface. The active surface includes a sensing area and numbers of electric pads. The encapsulation layer covers the side surface and the back surface of the sensor and exposes the active surface of the sensor. The encapsulation layer includes a first surface coplanar with the active surface of the sensor and a second surface opposite to the first surface. The first redistribution layer covers at least a part of the active surface of the sensor and at least a parts of the first surface of the encapsulation layer. The sensing area of the sensor is exposed from the first redistribution layer. The first redistribution layer is electrically connected to the electric pads of the sensor. The PID layer covers the first redistribution layer, the first surface of the encapsulation layer and the active surface of the sensor. The via plugs are disposed around the sensor and pass through the encapsulation layer. The via plugs are electrically connected to the first redistribution layer on the first surface of the encapsulation layer, and extend to the second surface of the encapsulation layer. A cross section of each via plug at the first surface of the encapsulation layer has a first diameter, and a cross section of each via plug at the second surface of the encapsulation layer has a second diameter, and the first diameter is less than the second diameter. The ratio of the first diameter to the second diameter is 40%~80%.

In one embodiment of the present invention, the PID layer covers the electric pads of the sensor and the sensing area.

In another embodiment of the present invention, the PID layer covers the electric pads of the sensor, and exposes the sensing area of the sensor.

To achieve the above, the present invention further provides a method of manufacturing a sensor package. First, a panel type carrier and a release film disposed on the panel type carrier are provided. Subsequently, sensors are provided. Each sensor includes at least one side surface, a back surface and an active surface. Each active surface includes a sensing area and numbers of electric pads. Next, the sensors are fixed onto the panel type carrier by utilizing the release film, with the active surfaces of the sensors toward the panel type carrier. Thereafter, an encapsulation layer is formed to cover the release film, the side surfaces of the sensors and the back surfaces of the sensors. The encapsulation layer includes a first surface contacting the release film and a second surface opposite to the first surface. Next, a drilling process is performed to form numbers of via holes disposed around the sensors. The via holes pass through the encapsulation layer. A cross section of each via hole at the first surface of the encapsulation layer has a first diameter, and a cross section of each via hole at the second surface of the encapsulation layer has a second diameter, and the first diameter is less than the second diameter. Thereafter, the via holes are filled to form numbers of via plugs in the via holes. The via plugs extend from the second surface of the encapsulation layer to the first surface of the encapsulation layer. Next, the release film and the panel type carrier are removed from the sensors and the encapsulation layer. Thereafter, a first redistribution layer is formed. The first redistribution layer is disposed on the via plugs and the electric pads of the sensors to expose the sensing area of the sensor. The first redistribution layer electrically connects the electric pads of the sensors and the via plugs. Next, a PID layer is formed to cover the first redistribution layer and the first surface of the encapsulation layer. Then, a dicing process is performed to cut the PID layer and the encapsulation layer, so to separate the sensors from each other.

Accordingly, the via plugs with truncated cone shapes are formed in the encapsulation layer through TOSV technology in the sensor package of the present invention. The ratio of the first diameter of via plug at the sensor side to the second diameter of via plug at the opposite side is 40%-80%. Since such via plugs are utilized as the electrical connections between the sensor and the external PCB, thinner packages and lower manufacturing cost are achieved in the present invention. In addition, the manufacturing method of the present invention is carried out with a panel level packaging process to handle large numbers of sensors in batch. Thereby, the present invention yields several times as much as the prior art, and the production efficiency is effectively improved.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

The parts in the drawings are not necessarily drawn to scale, the emphasis instead being placed upon clearly illustrating the principles of at least one embodiment. In the drawings, like reference numerals designate corresponding parts throughout the various diagrams, and all the diagrams are schematic.

FIG. 5A, FIG. 5B and FIG. 6 through FIG. 12 are schematic diagrams illustrating a method of manufacturing sensor packages according to the first embodiment of the present invention, in which FIG. 5B shows a top view of the manufacturing method in FIG. 5A.

DETAILED DESCRIPTION

Reference will now be made to the drawings to describe various inventive embodiments of the present disclosure in detail, wherein like numerals refer to like elements throughout.

Figure 1:
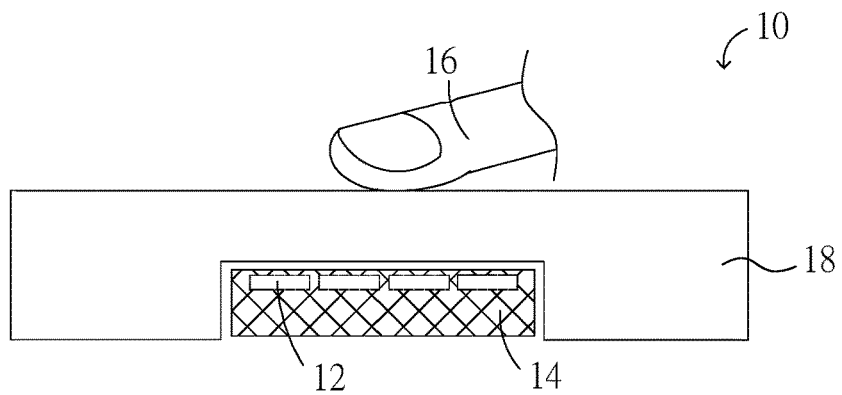
FIG. 1 is a schematic diagram illustrating an operation of a conventional fingerprint sensor package.
Figure 2:
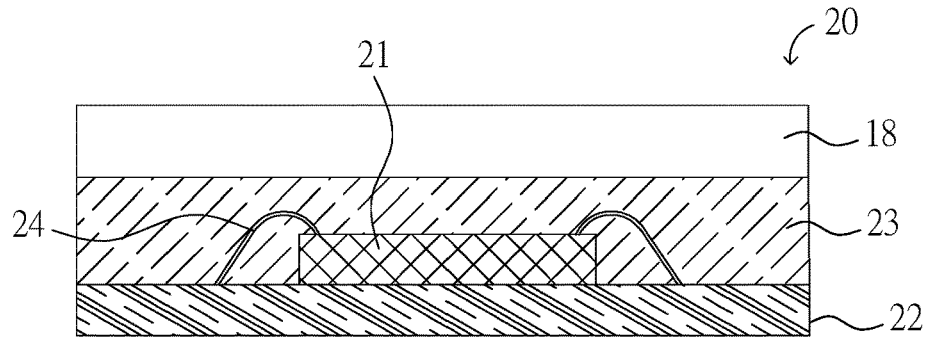
FIG. 2 is a schematic diagram illustrating a conventional wire bound (WB) package.
Figure 3:
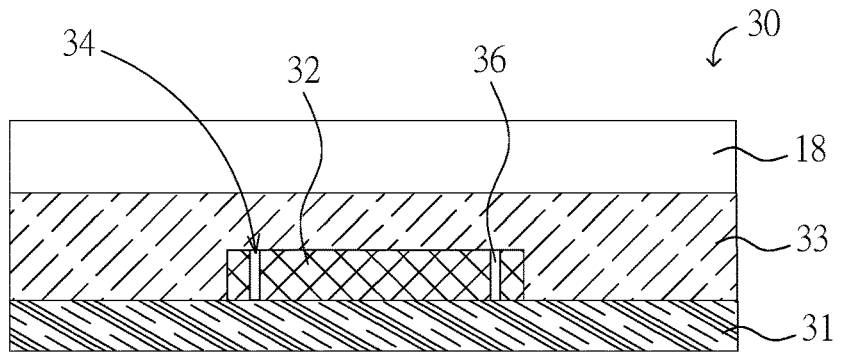
FIG. 3 is a schematic diagram illustrating a conventional through silicon via (TSV) package.
Figure 4:
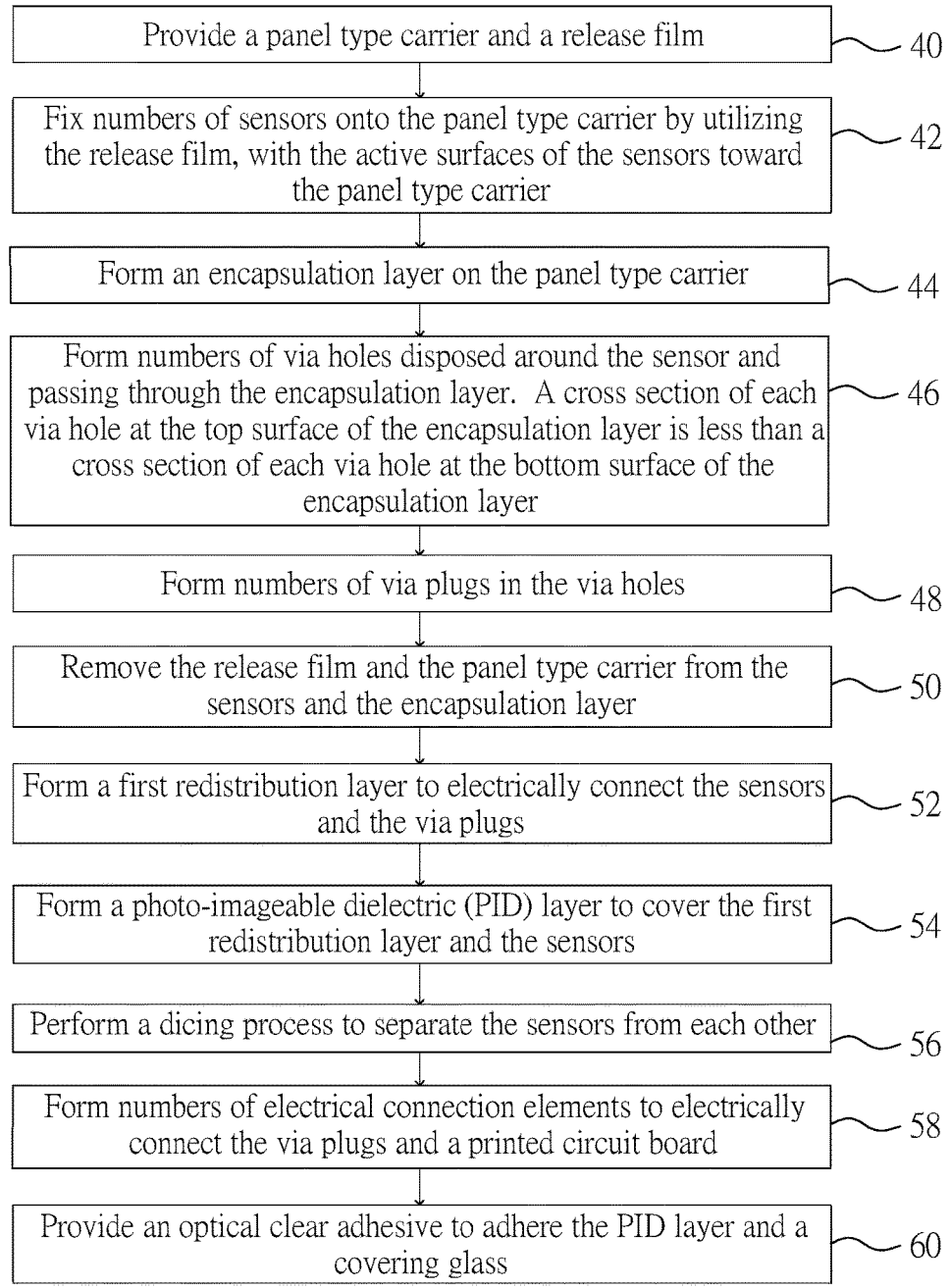
FIG. 4 is a flow chart showing a method of manufacturing sensor packages according to the present invention.
Figure 5A:
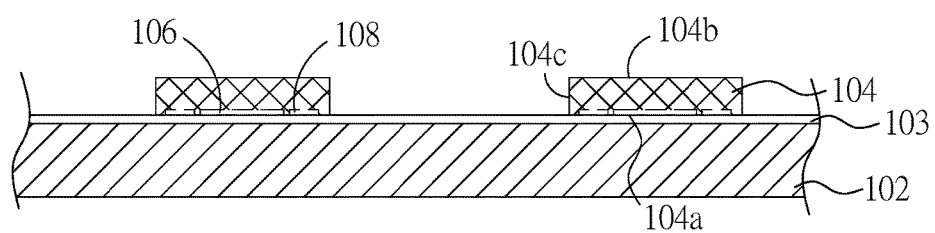
Figure 5B:
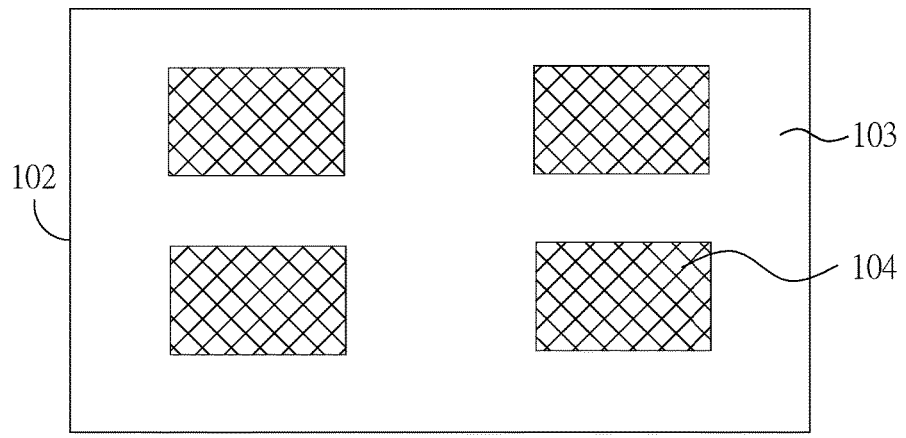

FIG. 4 is a flow chart showing a method of manufacturing sensor packages 100 according to the present invention. FIG. 5A, FIG. 5B and FIG. 6 through FIG. 12 are schematic diagrams illustrating a method of manufacturing sensor packages 100 according to the first embodiment of the present invention, in which FIG. 5B shows a top view of the intermediate sensor package made in FIG. 5A, and FIG. 9B shows a top view of the intermediate sensor package manufacturing method in FIG. 9A.

As shown in FIG. 5A, FIG. 5B and the step 40 of FIG. 4, a panel type carrier 102 and a peelable film 103 are first provided. The peelable film 103 is disposed on a surface of the panel type carrier 102. The peelable film 103 may be a release film. The panel type carrier 102 may include a metal material, such as iron, steel or cupper.

As shown in FIG. 5A, FIG. 5B, and the step 42 of FIG. 4, a sensor adhering process is subsequently performed. In the sensor adhering process, numbers of sensors 104 are provided. The sensors 104 may be fingerprint sensors or the complementary metal-oxide-semiconductor (CMOS) image sensors. Each sensor 104 has an active surface 104a, a back surface 104b and four side surfaces 104c. Each active surface 104a includes a sensing area 106 and numbers of electric pads 108. After that, the sensors 104 are fixed onto the panel type carrier 102 by utilizing the peelable film 103, with the active surfaces 104a of the sensors 104 toward the panel type carrier 102. Four sensors 104 are shown in the drawings as an example to illustrate the present invention, but numbers of the sensors 104 are not limited.

Figure 6:
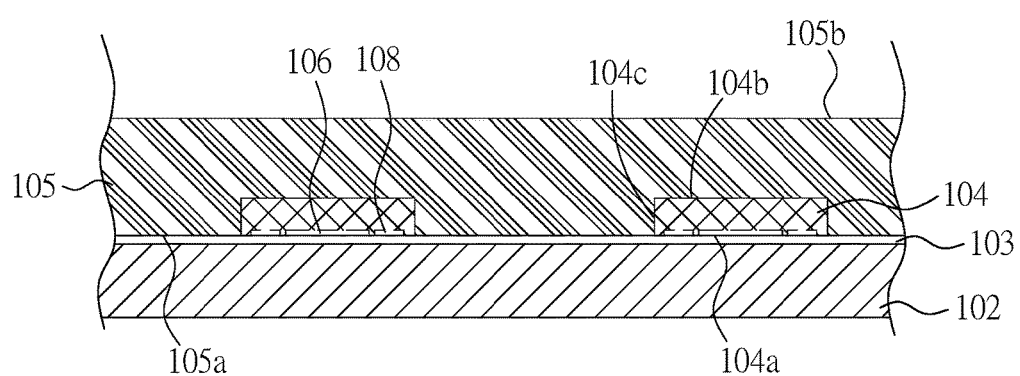

As shown in FIG. 6 and the step 44 of FIG. 4, a molding process is thereafter performed to form an encapsulation layer 105 covering the peelable film 103, the side surfaces 104c of the sensors 104 and the back surfaces 104b of the sensors 104. The encapsulation layer 105 includes a first surface 105a and a second surface 105b opposite to the first surface 105a. The first surface 105a of the encapsulation layer 105 contacts the peelable film 103.

The processes of forming the encapsulation layer 105 includes steps of providing an encapsulating material into a mold (not shown in the figures), heating the encapsulating material, injecting the flowing encapsulating material through a runner and a gate into a cavity, in which the sensors 104 and the panel type carrier 102 are disposed, molding, and performing a baking process to curing the encapsulation layer 105. The encapsulation layer 105 includes an epoxy molding compound (EMC, also called as solid molding material). The EMC may include silicone, epoxy, a hardener and a flame retardant.

In the embodiment, the encapsulation layer 105 is one of the high filler content dielectric material, which is based on epoxy resin as the main material. In epoxy molding compound, the epoxy resin is about 8 wt. % to 12 wt. % and the filler is about 70 wt. % to 90 wt. %. The filler may include silica and alumina to increase the mechanical strength, reduce the linear thermal expansion coefficient, increase heat conduction, increase water resistance and reduce the effectiveness of rubber overflow.

Figure 7:
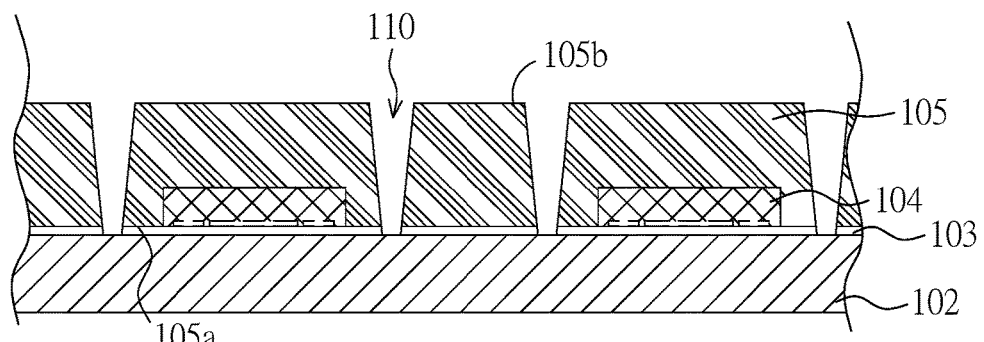

As shown in FIG. 7 and the step 46 of FIG. 4, a laser drilling process is next performed to form numbers of via holes 110 disposed around the sensors 104. The via holes 110 may pass through both the encapsulation layer 105 and the peelable film 103. A cross section of each via hole 110 at the first surface 105a of the encapsulation layer 105 has a first diameter, and a cross section of each via hole 110 at the second surface 105b of the encapsulation layer 105 has a second diameter, and the first diameter is less than the second diameter. In this embodiment, the ratio of the first diameter to the second diameter is substantially 40%~80%. The material of the panel type carrier 102 is different from the materials of the encapsulation layer 105 and the peelable film 103, so the laser drilling process can automatically stop on the different material. For example, the panel type carrier 102 includes metal material with higher hardness than the encapsulation layer 105 and the peelable film 103, so the laser drilling process may automatically stop on the surface of the panel type carrier 102 after drilling the peelable film 103.

Figure 8:
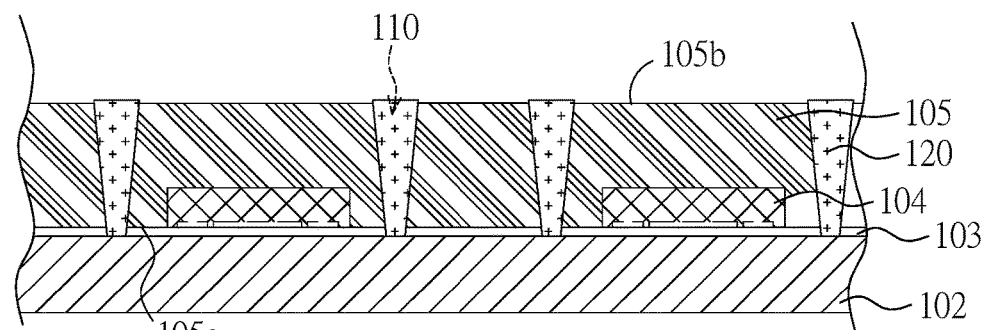

As shown in FIG. 8 and the step 48 of FIG. 4, the via holes 110 are thereafter filled with conductive materials to form numbers of via plugs 120 in the via holes 110. For forming the via plugs 120, for example, a copper (Cu) plating process or an electroless Cu plating process is first performed to form a Cu layer in the via holes 110, and a grinding process is performed to remove the extra Cu located on the second surface 105b of the encapsulation layer 105. Thus, the remaining Cu located in the via holes 110 forms the via plugs 120. Since the via holes 110 pass through both the peelable film 103 and the encapsulation layer 105, the via plugs 120 formed in the via holes 110 extend from the second surface 105b of the encapsulation layer 105 to both the peelable film 103 and the first surface 105a of the encapsulation layer 105. The via plugs 120 protrude from both the first surface 105a and the second surface 105b of the encapsulation layer 105.

Figure 9A:
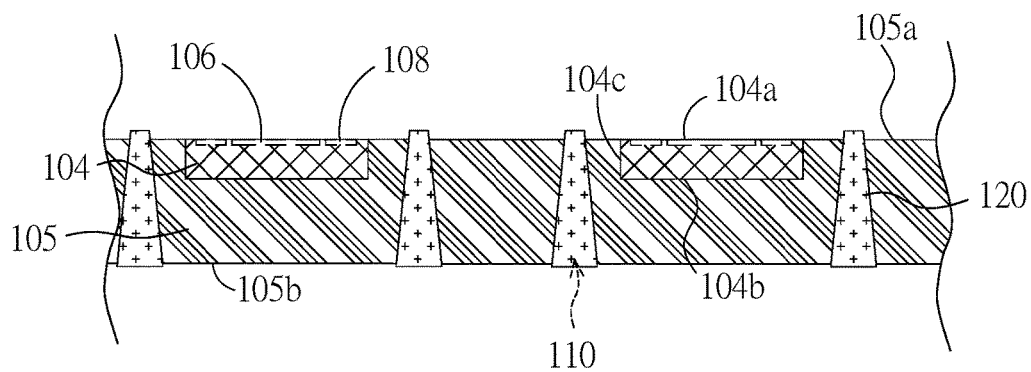
Figure 9B:
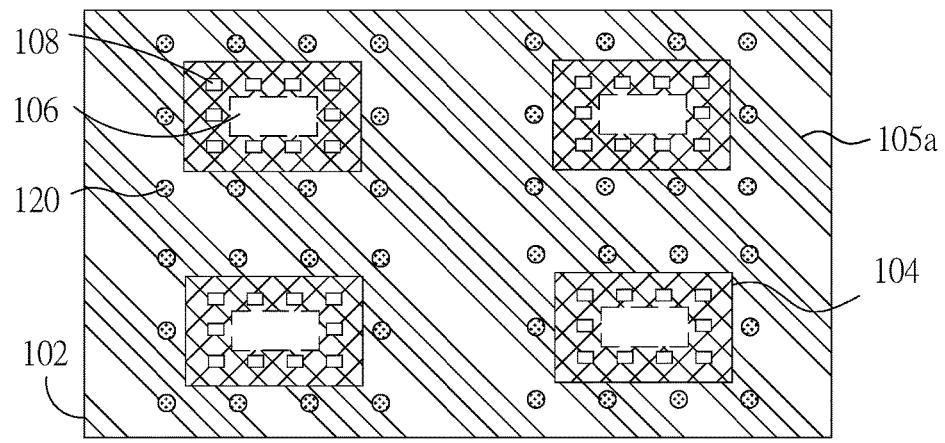
FIG. 9B shows a top view of the manufacturing method in FIG. 9A.

As shown in FIG. 9A, FIG. 9B and the step 50 of FIG. 4, the peelable film 103 and the panel type carrier 102 are next removed from the sensors 104 and the encapsulation layer 105. The sensors 104 and the encapsulation layer 105 are then turned upside down.

Figure 10:
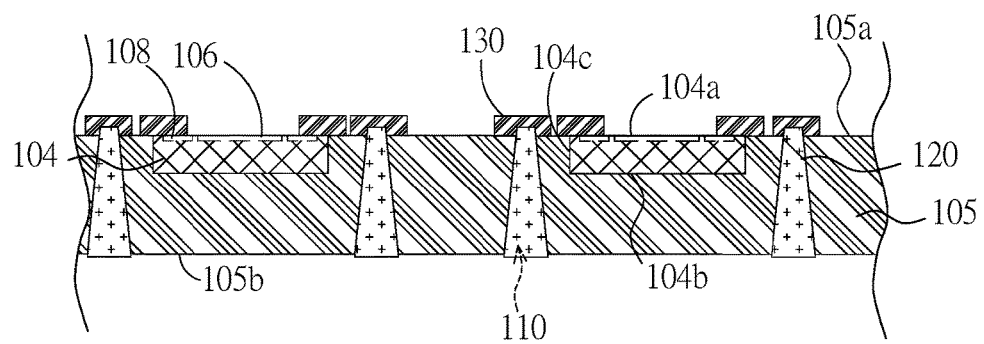

As shown in FIG. 10 and the step 52 of FIG. 4, a first redistribution layer (RDL) 130 is thereafter formed on the via plugs 120, the electric pads 108 of the sensors 104 and parts of the first surface 105a of the encapsulation layer 105. The sensing area 106 is exposed from the first redistribution layer 130. The first redistribution layer 130 electrically connects the electric pads 108 of the sensors 104 and the via plugs 120. Portions of the via plugs 120 protruding from the first surface 105a of the encapsulation layer 105 are buried in the first redistribution layer 130. Accordingly, external devices could electrically connects the sensors 104 through the via plugs 120 exposed by the encapsulation layer 105. The first redistribution layer 130 may be a single-layer structure or a multi-layer structure, and numbers of the layers are not limited. Accordingly, the first redistribution layer 130 connects the sensors 104, extends to the surface of the encapsulation layer 105, and function as a fan out structure. The first surface 105a of the encapsulation layer 105 is coplanar with the active surfaces 104a of the sensors 104.

It is noted that, if the encapsulation layer 105 is a high filler content dielectric material, an additional process, such as a roughness-adjusting process, should be performed on at least a portion of the first surface 105a of the encapsulation layer 105 before the first redistribution layer 130 is formed.

Figure 11:
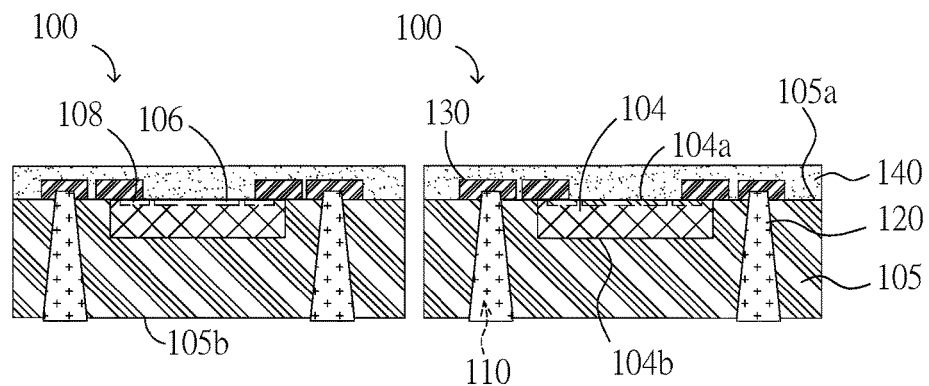

As shown in FIG. 11 and the step 54 of FIG. 4, a PID layer 140 is next formed to cover the first redistribution layer 130, the exposed first surface 105a of the encapsulation layer 105 and the exposed active surfaces 104a of the sensors 104. The PID layer 140 covers both the electric pads 108 and the sensing areas 106 of the sensors 104.

As shown in FIG. 11 and the step 56 of FIG. 4, a dicing process is thereafter performed to cut the PID layer 140 and the encapsulation layer 105, so to separate the sensors 104 from each other. Thus, numbers of sensor package 100 are formed in batch, and the side surface of the PID layer 140 is flush with the side surface of the encapsulation layer 105. The fan-out of a logic gate output is the number of gate inputs it can drive. The maximum fan-out of an output measures its load-driving capability: it is the greatest number of inputs of gates of the same type to which the output can be safely connected to the PCB.

Figure 12:
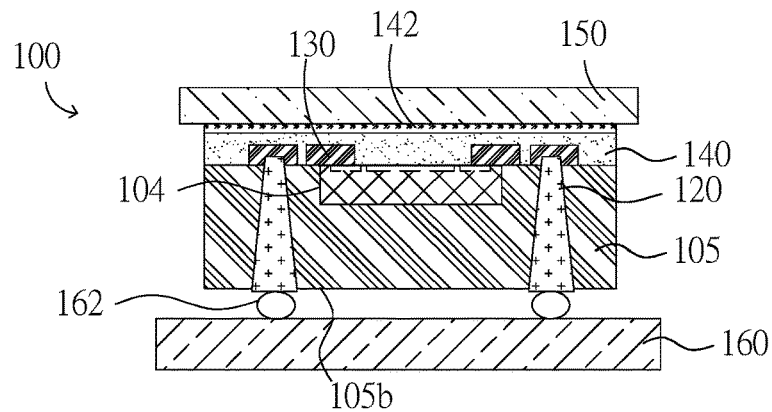

As shown in FIG. 12, the step 58 of FIG. 4, numbers of electrical connection elements 162 are selectively formed on the second surface 105b of the encapsulation layer 105. The electrical connection elements 162 electrically connect the via plugs 120 and a printed circuit board (PCB) 160. The sensors 104 are electrically connected to the PCB 160 through the via plugs 120 disposed outside the sensors 104. The via plug 120 has a truncated cone shape, and the terminal near the sensors 104 is less than the terminal near the PCB 160.

As shown in FIG. 12 and the step 60 of FIG. 4, an optical adhesive 142 is thereafter formed on the whole top surface of the PID layer 140, and a covering glass 150 is further provided on the optical adhesive 142. The optical adhesive 142 is utilized to adhere the PID layer 140 and the covering glass 150. The optical adhesive 142 may include an optical clear adhesive (OCA) or an optical clear resin (OCR), and is not limited to this embodiment.

In this embodiment, the electrical connection elements 162 may be solder balls, so that the formed sensor packages are ball grid array (BGA) structures. The solder balls of BGA can fix and electrically connect the sensors 104 to PCB. In comparison with dual in-line package or quad flat package, a BGA structure can provide more interconnection pins. The leads of BGA are also on average shorter than with a perimeter-only type, leading to better performance at high speeds. In other embodiments, the electrical connection elements 162 may be conductive bumps of gold or copper.

In other embodiments of the present invention, the exposed via plugs 120 on the second surface 105b of the encapsulation layer 105 are lands, so the formed sensor packages are land grid array (LGA) structures. The LGA is a type of surface-mount packaging for ICs that is notable for having the pins on the socket rather than the integrated circuit. An LGA can be electrically connected to a PCB either by the use of a socket or by soldering directly to the board. Unlike pin grid arrays, the land grid array packages setup provides higher pin densities and less broken pins.

Figure 13:
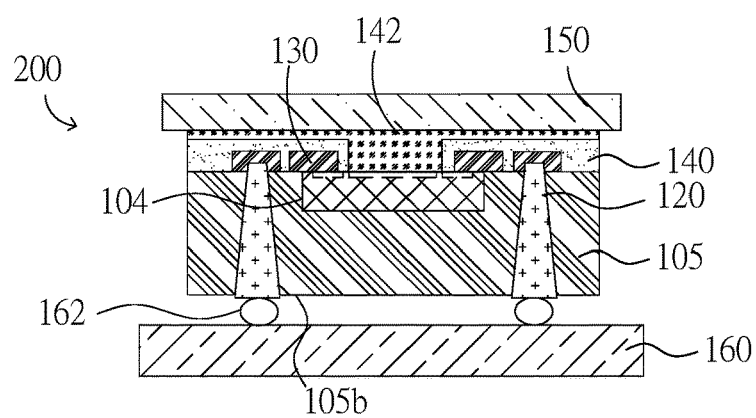
FIG. 13 is a schematic diagram illustrating a method of manufacturing sensor packages according to the second embodiment of the present invention.

FIG. 13 is a schematic diagram illustrating a method of manufacturing sensor packages 200 according to the second embodiment of the present invention. The difference between the first embodiment and the second embodiment is that portions of the PID layer 140 located on the sensing areas 106 are replaced by the optical adhesive 142 in the second embodiment.

In detail, as shown in FIG. 13, a patterning process is performed to remove the portions of the PID layer 140 located on the sensing areas 106. In such a case, the PID layer 140 covers the electric pads 108 of the sensors 104, and exposes the sensing areas 106 of the sensors 104. Thus, when the optical adhesive 142 is provided in the following step 60, the recesses of the PID layer 140 are filled with the optical adhesive 142, and the optical adhesive 142 covers the PID layer 140 and the sensing areas 106 of the sensors 104 in the sensor package 200. In such a case, the optical clear resin with a liquid state is suitable for the optical adhesive 142.

The second embodiment can be applied to various products. For example, when the sensors 104 are the CMOS image sensors, the structure of the sensor package 200 can increase the sensitivity of the sensors 104. The recesses of the PID layer 140 located on the sensing areas 106 are apertures for the sensor package 200. Since the optical adhesive 142 are transparent for external light, the sensor package 200 can access amounts of light.

Figure 14:
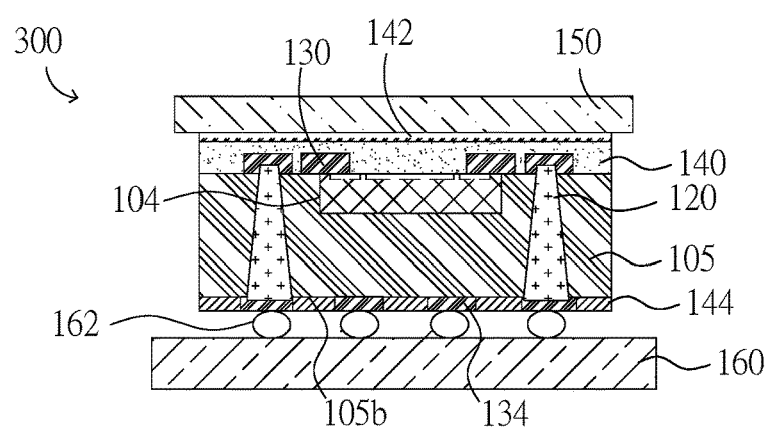
FIG. 14 is a schematic diagram illustrating a method of manufacturing sensor packages according to the third embodiment of the present invention.

FIG. 14 is a schematic diagram illustrating a method of manufacturing sensor packages 300 according to the third embodiment of the present invention. The difference between the third embodiment and the first embodiment is that the third embodiment further includes a second redistribution layer 134 and a dielectric layer 144.

As shown in FIG. 14, the second redistribution layer 134 and the dielectric layer 144 are formed on the encapsulation layer 105, after forming the via plugs 120 (after the step 50), and before forming the electrical connection elements 162 (before the step 52, the step 54, the step 56 or the step 58). In such a case, the second redistribution layer 134 and the dielectric layer 144 cover the second surface 105b of the encapsulation layer 105. The second redistribution layer 134 is utilized to electrically connect the via plugs 120 and the electrical connection elements 162. The via plugs 120 protruding from the second surface 105b of the encapsulation layer 105 are buried in the second redistribution layer 134. The second redistribution layer 134 can redistribute the locations of external connection pads, which are the electrical connection elements 162 or the terminals of the second redistribution layer 134 in the embodiments, to fit the pads of the PCB 160.

In summary, the via plugs with truncated cone shapes are formed in the encapsulation layer through TOSV technology in the sensor package of the present invention. The ratio of the first diameter of via plug at the sensor side to the second diameter of via plug at the opposite side is 40%~80%. Since such via plugs are utilized as the electrical connections between the sensor and the external PCB, thinner packages and lower manufacturing cost are achieved in the present invention. In addition, the manufacturing method of the present invention is carried out with a panel level packaging process to handle large numbers of sensors in batch. Thereby, the present invention yields several times as much as the prior art, and the production efficiency is effectively improved.

Even though numerous characteristics and advantages of certain inventive embodiments have been set out in the foregoing description, together with details of the structures and functions of the embodiments, the disclosure is illustrative only. Changes may be made in detail, especially in matters of arrangement of parts, within the principles of the present disclosure to the full extent indicated by the broad general meaning of the terms in which the appended claims are expressed.

What is claimed is:

1. A sensor package, comprising:
   a sensor, the sensor comprising at least one side surface, a back surface and an active surface, the active surface comprising a sensing area and a plurality of electric pads;
   an encapsulation layer covering the at least one side surface and the back surface of the sensor and exposing the active surface of the sensor, the encapsulation layer comprising a first surface coplanar with the active surface of the sensor and a second surface opposite to the first surface;
   a first redistribution layer covering at least a part of the active surface of the sensor and at least a part of the first surface of the encapsulation layer, the first redistribution layer being electrically connected to the electric pads of the sensor;
   a photo-imageable dielectric (PID) layer covering the first redistribution layer, the first surface of the encapsulation layer and the active surface of the sensor; and
   a plurality of via plugs disposed around the sensor and passing through the encapsulation layer, the via plugs being electrically connected to the first redistribution layer on the first surface of the encapsulation layer, and extending to the second surface of the encapsulation layer, wherein a cross section of each of the via plugs at the first surface of the encapsulation layer has a first diameter, and a cross section of each of the via plugs at the second surface of the encapsulation layer has a second diameter, and the first diameter is less than the second diameter,
   wherein the via plugs protrudes from the first surface of the encapsulation layer, and portions of the via plugs protruding from the first surface of the encapsulation layer are buried in the first redistribution layer.

2. The sensor package of claim 1, wherein a ratio of the first diameter to the second diameter of each of the via plugs is 40%-80%.

3. The sensor package of claim 1, wherein the via plugs protrudes from the second surface of the encapsulation layer.

4. The sensor package of claim 1, wherein the encapsulation layer is a high filler content dielectric material, in which a filler content is 70 weight percentage (wt. %) to 90 wt. %.

5. The sensor package of claim 1, wherein the PID layer covers the electric pads and the sensing area of the sensor.

6. The sensor package of claim 5, further comprising:
   an optical adhesive covering the PID layer; and
   a covering glass covering the optical adhesive, wherein the optical adhesive connects the PID layer and the covering glass.

7. The sensor package of claim 1, wherein the PID layer covers the electric pads of the sensor, and exposes the sensing area of the sensor.

8. The sensor package of claim 7, further comprising:
an optical adhesive covering both the PID layer and the sensing area of the sensor; and
a covering glass covering the optical adhesive, wherein the optical adhesive connects the PID layer and the covering glass.

9. The sensor package of claim 1, further comprising a second redistribution layer covering the second surface of the encapsulation layer, wherein the second redistribution layer is electrically connected to the via plugs.

10. The sensor package of claim 3, further comprising a second redistribution layer covering the second surface of the encapsulation layer, wherein portions of the via plugs protruding from the second surface of the encapsulation layer are buried in the second redistribution layer.

11. A method of manufacturing a sensor package, comprising:
providing a panel type carrier and a release film disposed on the panel type carrier;
providing a plurality of sensors, each of the sensors comprising at least one side surface, a back surface and an active surface, each of the active surfaces comprising a sensing area and a plurality of electric pads;
fixing the sensors onto the panel type carrier by utilizing the release film, with the active surfaces of the sensors toward the panel type carrier;
forming an encapsulation layer to cover the release film, the side surfaces of the sensors and the back surfaces of the sensors, the encapsulation layer comprising a first surface contacting the release film and a second surface opposite to the first surface;
performing a drilling process to form a plurality of via holes disposed around the sensors and passing through the encapsulation layer, wherein a cross section of each of the via holes at the first surface of the encapsulation layer has a first diameter, and a cross section of each of the via holes at the second surface of the encapsulation layer has a second diameter, and the first diameter is less than the second diameter;
filling the via holes to form a plurality of via plugs in the via holes, the via plugs extending from the second surface of the encapsulation layer to the first surface of the encapsulation layer;
removing the release film and the panel type carrier from the sensors and the encapsulation layer;
forming a first redistribution layer disposed on the via plugs and the electric pads of the sensors, the first redistribution layer electrically connecting the electric pads of the sensors and the via plugs;
forming a photo-imageable dielectric (PID) layer covering the first redistribution layer and the first surface of the encapsulation layer; and
performing a dicing process to cut the PID layer and the encapsulation layer, so to separate the sensors from each other.

12. The method of claim 11, wherein the drilling process comprising drilling through the encapsulation layer and the release film, and the via plugs filling the via holes extend from the second surface of the encapsulation layer into the release film.

13. The method of claim 11, wherein a ratio of the first diameter to the second diameter of each of the via plugs is 40%-80%.

* * * * *